(12) United States Patent
Matsumoto

(10) Patent No.: US 12,432,848 B2
(45) Date of Patent: Sep. 30, 2025

(54) WIRING BOARD AND ELECTRONIC EQUIPMENT

(71) Applicant: CANON KABUSHIKI KAISHA, Tokyo (JP)

(72) Inventor: Shoji Matsumoto, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 211 days.

(21) Appl. No.: 18/342,941

(22) Filed: Jun. 28, 2023

(65) Prior Publication Data

US 2024/0023231 A1  Jan. 18, 2024

(30) Foreign Application Priority Data

Jul. 15, 2022 (JP) ................................ 2022-114387

(51) Int. Cl.
*H05K 1/02* (2006.01)

(52) U.S. Cl.
CPC ........... *H05K 1/0245* (2013.01); *H05K 1/025* (2013.01); *H05K 2201/09236* (2013.01)

(58) Field of Classification Search
CPC .............................. H05K 1/0245; H05K 1/025
See application file for complete search history.

(56) References Cited

U.S. PATENT DOCUMENTS

| | | | |
|---|---|---|---|
| 7,564,695 B2 | 7/2009 | Matsumoto | |
| 7,595,546 B2 | 9/2009 | Matsumoto | |
| 8,428,155 B2 | 4/2013 | Matsumoto | |
| 10,306,761 B2 | 5/2019 | Numagi | |
| 10,716,211 B2 | 7/2020 | Numagi | |
| 11,019,719 B2 | 5/2021 | Matsumoto | |
| 11,043,525 B2 | 6/2021 | Matsumoto | |
| 11,610,930 B2 | 3/2023 | Matsumoto | |
| 2003/0163373 A1* | 8/2003 | Cornateanu | G06Q 30/02 705/14.26 |
| 2015/0055307 A1* | 2/2015 | Shaw | H05K 1/0253 174/251 |
| 2023/0133827 A1 | 5/2023 | Matsumoto | |

FOREIGN PATENT DOCUMENTS

| | | |
|---|---|---|
| JP | 2006-100384 A | 4/2006 |
| JP | 2012-227211 A | 11/2012 |
| JP | 2014-160690 A | 9/2014 |
| JP | 2016-12853 A | 1/2016 |

* cited by examiner

*Primary Examiner* — Jeremy C Norris
(74) *Attorney, Agent, or Firm* — VENABLE LLP

(57) ABSTRACT

A wiring board includes: a first conductor layer; a second conductor layer formed so as to face the first conductor layer; a plurality of differential signal wirings, each of which includes a pair of signal wirings, formed in the first conductor layer; and a plurality of first ground wirings formed in the second conductor layer and arranged along and not overlapping the pairs of signal wirings in a plan view viewed in a facing direction in which the first conductor layer and the second conductor layer face each other; and a plurality of second ground wirings formed in the second conductor layer with spacings so as to intersect the first ground wirings and to connect the two first ground wirings adjacent to each other.

20 Claims, 16 Drawing Sheets

······· COMPARATIVE EXAMPLE: WITHOUT GROUND WIRING 103
— — EXAMPLE 1: WITH GROUND WIRING 103 (250 μm WIDTH, 10 mm PITCH)
——— EXAMPLE 2: WITH GROUND WIRING 103 (120 μm WIDTH, 5 mm PITCH)

TDR CHARACTERISTICS

......... COMPARATIVE EXAMPLE: WITHOUT GROUND WIRING 103
— — EXAMPLE 1: WITH GROUND WIRING 103 (250 μm WIDTH, 10 mm PITCH)
——— EXAMPLE 2: WITH GROUND WIRING 103 (120 μm WIDTH, 5 mm PITCH)

SIGNAL TRANSMISSION CHARACTERISTICS

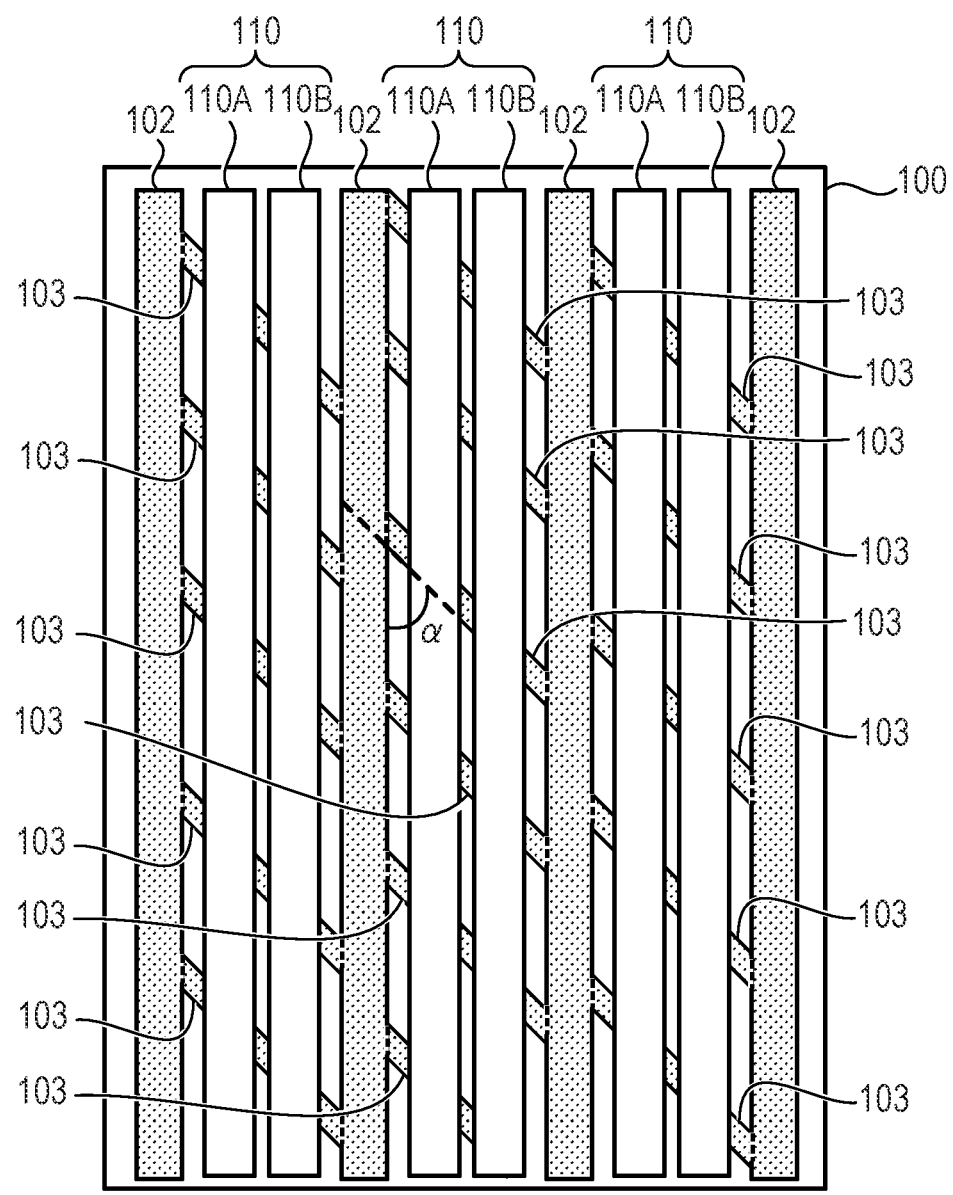

WIRING BOARD AND ELECTRONIC EQUIPMENT

BACKGROUND OF THE INVENTION

Field of the Invention

The present invention relates to a wiring board and an electronic equipment.

Description of the Related Art

Japanese Patent Application Laid-Open No. 2012-227211 discloses a wiring board for a differential signal including a first signal wiring and a second signal wiring which are differential wiring arranged in parallel on one surface of the insulating layer, and a wiring pattern that serves as a ground layer arranged with a plurality of openings on the other surface of the insulating layer. In the wiring board disclosed in Japanese Patent Application Laid-Open No. 2012-227211, the plurality of openings are arranged to be line symmetrical with respect to a reference line that is set parallel to the direction in which both the signal wirings are extended, is provided between both the signal wirings and has distances to both the signal wirings set equal to each other. The tangent line to the outer edge of each opening is formed to intersect the reference line at less than 90°.

In the wiring board disclosed in Japanese Patent Application Laid-Open No. 2012-227211, the ground wiring intersects between the two signal wirings constituting the differential wiring in a plane view seen in the direction where the layer including the signal wirings and the ground layer face each other, so that the area where the differential wiring faces the ground layer becomes large. Therefore, in the wiring board disclosed in Japanese Patent Application Laid-Open No. 2012-227211, since a large impedance mismatch occurs in the differential wiring and the transmission loss can be large especially in high-speed signal transmission, it is difficult to achieve excellent high-speed transmission characteristics.

The present invention intends to provide a wiring board that can achieve higher high-speed transmission characteristics.

SUMMARY OF THE INVENTION

According to one aspect of the present invention, there is provided a wiring board including wiring board comprising: a first conductor layer; a second conductor layer formed so as to face the first conductor layer; a plurality of differential signal wirings, each of which includes a pair of signal wirings, formed in the first conductor layer; and a plurality of first ground wirings formed in the second conductor layer and arranged along and not overlapping the pairs of signal wirings in a plan view viewed in a facing direction in which the first conductor layer and the second conductor layer face each other; and a plurality of second ground wirings formed in the second conductor layer with spacings so as to intersect the first ground wirings and to connect the two first ground wirings adjacent to each other.

Further features of the present invention will become apparent from the following description of exemplary embodiments with reference to the attached drawings.

BRIEF DESCRIPTION OF THE DRAWINGS

FIG. 7A is a plan view illustrating a modified example of the flexible printed wiring board according to the second embodiment of the present invention.

DESCRIPTION OF THE EMBODIMENTS

First Embodiment

An electronic equipment and a wiring board according to a first embodiment of the present invention will be described with reference to FIG. 1 to FIG. 5B.

Figure 1:
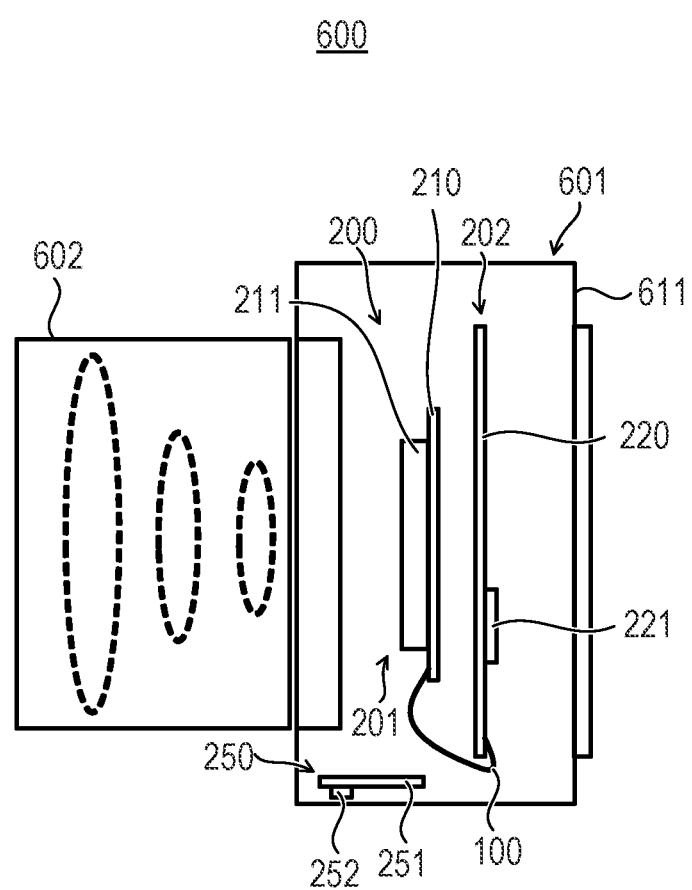
FIG. 1 is a schematic diagram illustrating an imaging apparatus as an example of an electronic equipment according to a first embodiment of the present invention.
Figure 2:
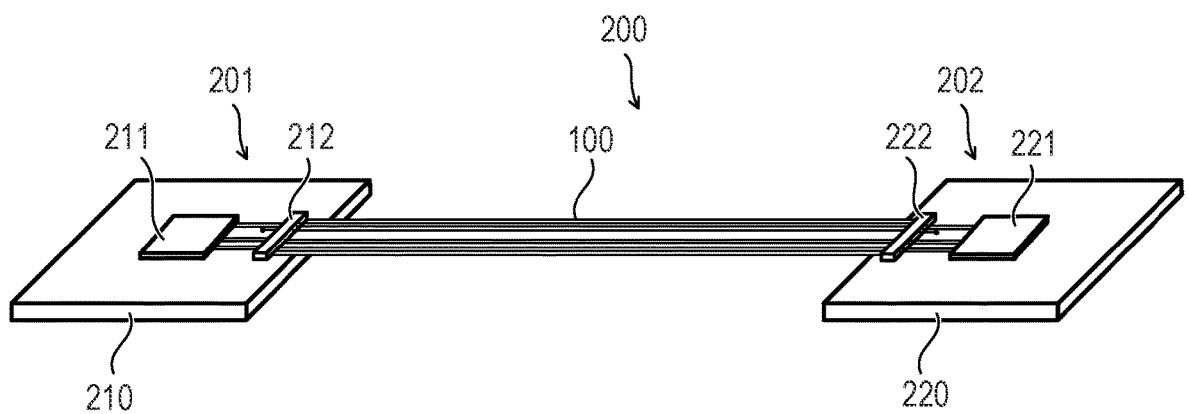
FIG. 2 is a schematic diagram illustrating an imaging unit according to the first embodiment of the present invention.

First, an imaging apparatus will be described with reference to FIG. 1 and FIG. 2 as an example of an electronic equipment according to the present embodiment. FIG. 1 is an explanatory view of a digital camera 600 that is an imaging apparatus as an example of an electronic equipment according to the present embodiment. FIG. 2 is an explanatory view of an imaging unit 200 according to the present embodiment.

As illustrated in FIG. 1, the digital camera 600 as an imaging apparatus is a lens interchangeable digital camera and includes a camera body 601. The camera body 601 is configured such that a lens unit (lens barrel) 602 including a lens is detachably attached thereto. The camera body 601 includes a housing 611, and an imaging unit 200 and a wireless communication unit 250 that are accommodated in the housing 611.

The imaging unit 200 includes a printed circuit board 201, a printed circuit board 202, and one flexible printed wiring board 100 that is a wiring board and electrically connects the printed circuit board 201 and the printed circuit board 202. The wiring structure can be made lighter than a coaxial cable by the flexible printed wiring board 100.

The printed circuit board 201 includes a printed circuit board 210 and a semiconductor device (first semiconductor device) 211 mounted on the printed circuit board 210. The printed circuit board 202 includes a printed circuit board 220 and a semiconductor device (second semiconductor device) 221 mounted on the printed circuit board 220.

The first semiconductor device 211 is an image sensor as an image pickup element. The image sensor is, for example, a CMOS (Complementary Metal Oxide Semiconductor) image sensor or a CCD (Charge Coupled Device) image sensor. The image sensor has a function of converting light incident through the lens unit 602 into an electric signal. The second semiconductor device 221 is a digital signal processor as a processing circuit. The digital signal processor has a function of acquiring an electric signal indicating image data from the image sensor, performing a process to correct the acquired electric signal, and generating corrected image data.

The wireless communication unit 250 performs wireless communication in the GHz band and is a modularized wireless communication module. The wireless communication unit 250 includes a printed wiring board 251 provided with an antenna (not illustrated) and a wireless communication IC 252 mounted on the printed wiring board 251. The antenna is provided in the same plane as the wireless communication IC 252, and is disposed near the housing 611 so as to easily communicate with the outside. The wireless communication IC 252 transmits and receives image data by performing wireless communication with an external device (such as a PC or a wireless router) via an antenna. That is, the wireless communication IC 252 modulates a digital signal indicating the image data and transmits it from the antenna as a radio wave of a radio standard communication frequency. Furthermore, the wireless communication IC 252 demodulates a radio wave received by the antenna into a digital signal indicating image data. The wireless communication IC 252 performs wireless communication with an external device in accordance with a standard such as WiFi (registered trademark) and Bluetooth (registered trademark), for example.

As illustrated in FIG. 2, a connector 212 is mounted on the printed wiring board 210. The connector 212 is electrically connected to the first semiconductor device 211 by a conductor formed on the printed wiring board 210. A connector 222 is mounted on the printed wiring board 220. The connector 222 is electrically connected to the second semiconductor device 221 by a conductor formed on the printed wiring board 220. That is, the first semiconductor device 211 and the second semiconductor device 221 are electrically connected by the printed wiring board 210, the flexible printed wiring board 100 and the printed wiring board 220, and can communicate with each other.

Figure 3A:
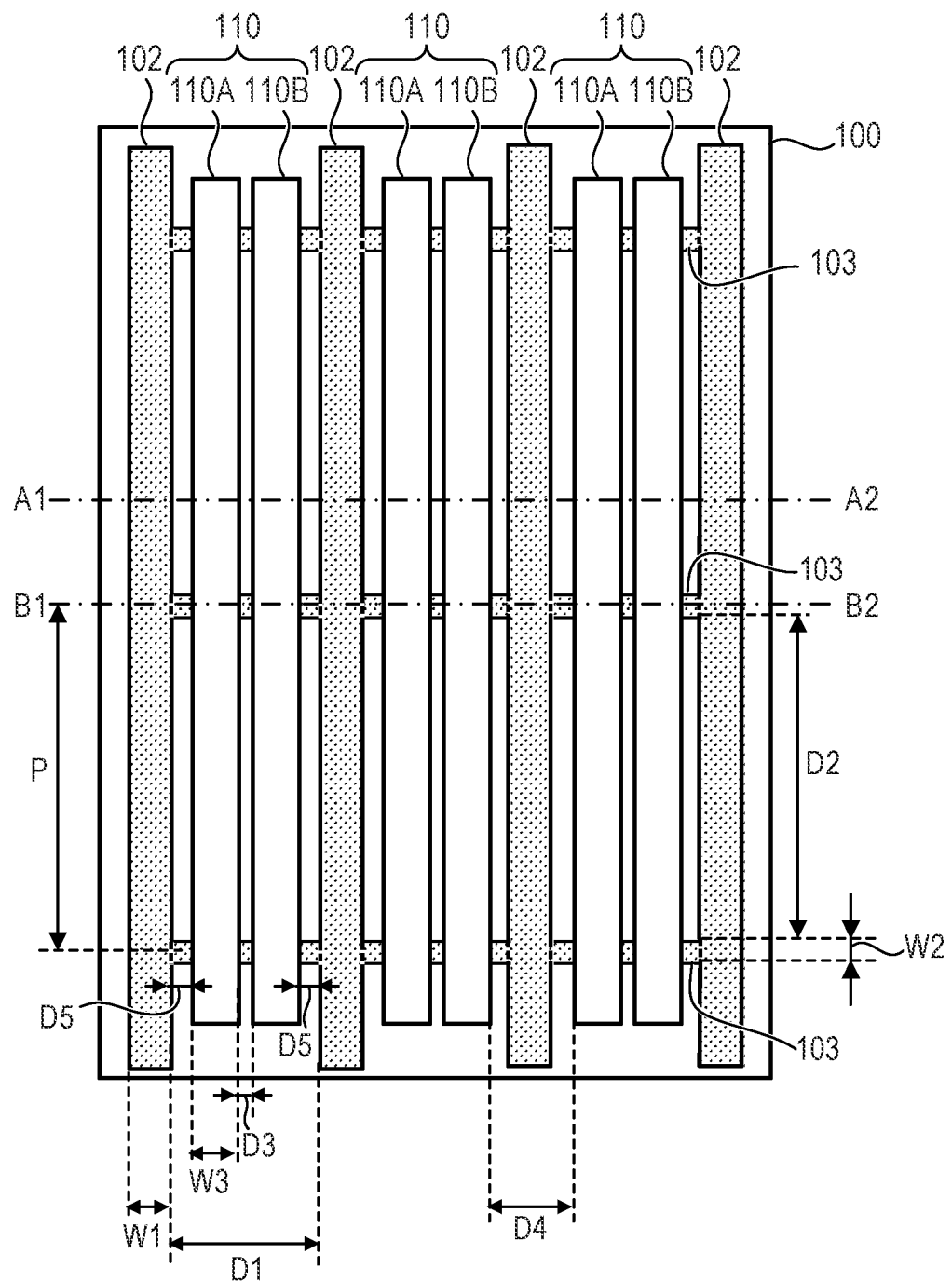
FIG. 3A is a plan view illustrating a flexible printed wiring board according to the first embodiment of the present invention.
Figure 3B:
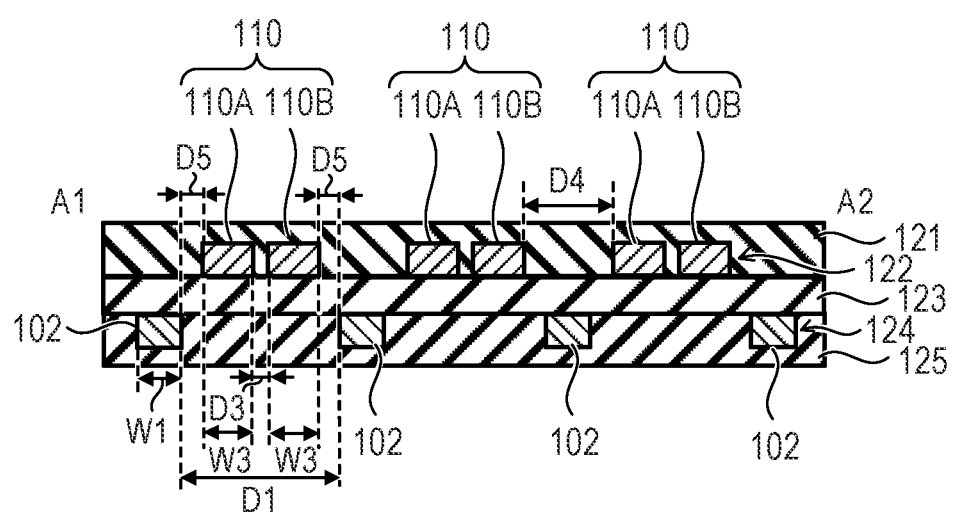
FIG. 3B is a cross-sectional view illustrating the flexible printed wiring board according to the first embodiment of the present invention.
Figure 3C:
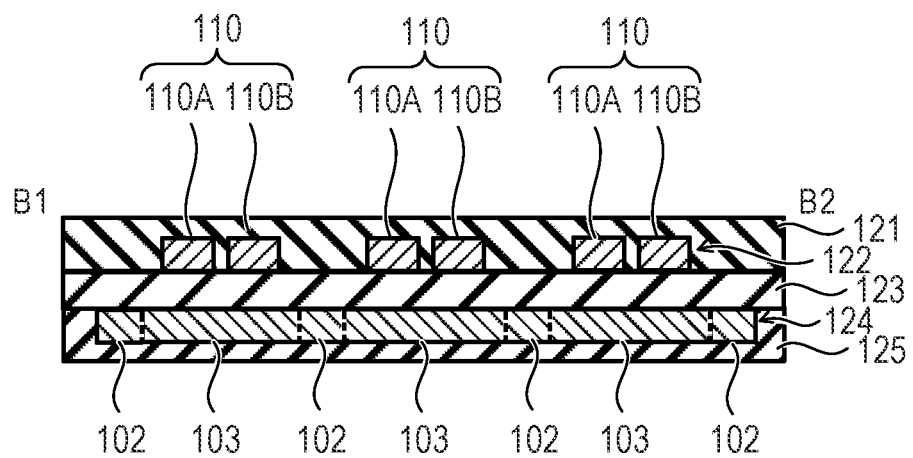
FIG. 3C is a cross-sectional view illustrating the flexible printed wiring board according to the first embodiment of the present invention.

Next, the flexible printed wiring board 100 according to the present embodiment will be described with reference to FIG. 3A to FIG. 3C. FIG. 3A is a plan view of the flexible printed wiring board 100 according to the present embodiment viewed from the top. FIG. 3B is a cross-sectional view illustrating the cross-section of the flexible printed circuit board 100 along line A1-A2 in FIG. 3A. FIG. 3C is a cross-sectional view illustrating the cross-section of the flexible printed circuit board 100 along the B1-B2 line in FIG. 3A.

As illustrated in FIG. 3B and FIG. 3C, the flexible printed wiring board 100 has a base layer 123, a conductor layer 122, a conductor layer 124, a cover layer 121, and a cover layer 125, and has a layer configuration including the two conductor layers 122 and 124. Note that the layer configuration of the flexible printed wiring board 100 is not limited to the structure illustrated in FIG. 3B and FIG. 3C, but may include other insulating layers, conductor layers, and the like.

The base layer 123 has a sheet-like shape having a first surface and a second surface facing the first surface. The conductor layer 122 is formed on the first surface, and the conductor layer 124 is formed on the second surface, among both the surfaces of the base layer 123. The conductor layer 122 and the conductor layer 124 face each other via the base layer 123. On the first surface of the base layer 123 on which the conductor layer 122 is formed, a cover layer 121 is formed outside the conductor layer 122 so as to cover the conductor layer 122. On the second surface of the base layer 123 on which the conductor layer 124 is formed, a cover layer 125 is formed on the outside of the conductor layer 124 so as to cover the conductor layer 124. The conductor layer 122 is a signal wiring layer. The conductor layer 124 is a ground layer.

A plurality of differential signal wirings 110 are formed in the conductor layer 122. The differential signal wring 110 is composed of a pair of a signal wring 110A and a signal wring 110B. A plurality of ground wirings 102 and ground wirings 103 are respectively formed in the conductor layer 124. The signal wiring 110A and the signal wiring 110B are formed parallel to each other along the longitudinal direction of the flexible printed wiring board 100. Thus, the differential signal wiring 110 is configured to transmit an electric signal along the longitudinal direction of the flexible printed wiring board 100. Specifically, the differential signal wring 110 transmits a data signal which is a digital signal indicating, for example, image data. Note that, in addition to the differential signal wiring 110, wiring for transmitting a single end signal such as a control signal or a response signal may be formed in the conductor layer 122.

The base layer 123 that is a base material is made of, for example, resin. Specific examples of the resin include polyimide-based resins such as polyimide, polyamide, and polyamide-imide, and the like, thermosetting resins such as epoxy and the like, and thermoplastic resins such as liquid crystal polymers and the like. Among them, polyimide or liquid crystal polymer is preferable. Polyimide has excellent heat resistance and mechanical properties, and is easily available commercially. The liquid crystal polymer is suitable for high-speed signal transmission applications because of its low relative dielectric constant and has low hygroscopicity and excellent dimensional stability. The thickness of the base layer 123 is not particularly limited, but is preferably in a range of 10 μm or more and 100 μm or less. If the thickness is less than 10 μm, the distance between the differential signal wring 110 and the ground wrings 102 and 103 becomes close, and the value of the characteristic impedance may become small. On the other hand, if the thickness of the thickness is more than 100 μm, the rigidity of the resin becomes high and the flexibility may become insufficient. More preferably, the range is 12 μm or more and 75 μm or less.

Although the flexible printed wiring board 100 will be described as an example of the wiring board in the present embodiment, note that the wiring board may be a rigid printed wiring board. In the case of a rigid printed wiring board, for example, a fiber base material can be used as the material of the base layer 123. Specifically, the fiber base material includes, for example, a glass fiber base material such as a glass fiber cloth, a glass non-fiber cloth, or the like, and an inorganic fiber base material such as a fiber cloth or a non-fiber cloth composed of an inorganic compound other than glass as a component. Furthermore, an organic fiber base material composed of an organic fiber such as an aromatic polyamide, a polyamide, an aromatic polyester, a polyester, a polyimide, a fluorine resin, or the like is also an example of fiber base material. Of these, the glass fiber base material is preferable from the viewpoint of excellent strength and low water absorption.

The formation methods of the conductor layers 122 and 124 are not particularly limited, but can be formed by known methods such as metal foil lamination, metal plating, inkjet process, or the like. When a copper foil is used as the metal foil, a film bonded with an adhesive or the like can be used to form a required transmission line pattern by a photolithographic etching process. In the case of using an inkjet process, a polymer ink containing metal particles having conductivity can be drawn in a required pattern, and the pattern can be formed by firing at a temperature equal to or lower than the glass transition point (Tg) of the base layer 123. The thickness of the conductor layer 122 (the thickness of the differential signal wiring 110) is not particularly limited, but is, for example, in a range of 0.1 μm or more and 25 μm or less. The thickness of the conductor layer 124 (the thickness of the ground wirings 102 and 103) is also similar to the thickness of the conductor layer 122.

Note that it is preferable that the distance between the wireless communication unit 250 and the conductor layer 124 is shorter than the distance between the wireless communication unit 250 and the conductor layer 122 in the housing 611 of the digital camera 600, which is the housing of the electronic equipment. That is, the conductor layer 124 in which the ground wirings 102 and 103 are formed is preferably disposed closer to the wireless communication unit 250 than the conductor layer 122 in which the differential signal wirings 110 are formed. Since the conductor layer 124 is closer to the wireless communication unit 250 than the conductor layer 122, it is possible to suppress the superposition of radiation noise generated from the conductor layer 122 in which the differential signal wirings 110 are formed on the radio wave of external communication performed by the wireless communication unit 250.

The cover layers 121 and 125 serve as a protective layer for the suppression of current flow to other components in the electronic equipment. Therefore, the cover layers 121 and 125 are made of a resin comprising an insulating and flexible cover film or a coating layer of insulating resin. As the cover film, a so-called engineering plastic can be used. The insulating resin may be an insulating resin, for example, a thermosetting resin or an ultraviolet curing resin. The thickness of the cover layers 121 and 125 is not particularly limited, but is preferably in the range of 5 μm or more and 50 μm or less, and is particularly preferably in the range of 10 μm or more and 35 μm or less. If the thickness is less than 5 μm, the strength may be insufficient. On the other hand, if the thickness is more than 50 μm, slidability and flexibility may decrease.

FIG. 3A illustrates the arrangement of the differential signal wirings 110 and the ground wirings 102 and 103 in a plan view of the flexible printed wiring board 100 viewed from the side of the cover layer 121, that is, in a plan view viewed in the facing direction in which the conductor layer 122 and the conductor layer 124 face each other.

As illustrated in FIG. 3A, the plurality of differential signal wirings 110 are arranged in parallel with each other along the longitudinal direction of the flexible printed wiring board 100. The pair of the signal wiring 110A and the signal wiring 110B constituting each differential signal wiring 110 are arranged in parallel with each other along the longitudinal direction of the flexible printed wiring board 100. The signal wiring 110A and the signal wiring 110B have the same width.

The plurality of ground wirings 102 are formed in the conductor layer 124 so as to be disposed along the longitudinal direction of the flexible printed wiring board 100. Here, the plurality of ground wirings 102 are arranged in parallel with each other along the longitudinal direction of the flexible printed wiring board 100. The ground wiring 102 is arranged along the signal wiring 110A and the signal wiring 110B. Here, the signal wirings 110A and 110B and the ground wiring 102 are arranged in parallel with each other. The pair of the signal wiring 110A and the signal wiring 110B constituting the differential signal wirings 110 are disposed between the two ground wirings 102 adjacent to each other. Therefore, the pair of the signal wiring 110A and the signal wiring 110B do not overlap the ground wirings 102 projected on the conductor layer 122. Thus, the plurality of ground wirings 102 are arranged so that they are parallel to and do not overlap with the pair of the signal wiring 110A and the signal wiring 110B in a plan view viewed in the facing direction in which the conductor layer 122 and the conductor layer 124 are facing each other.

The two ground wirings 102 adjacent to each other are connected by the plurality of ground wirings 103. The plurality of ground wirings 103 are formed in the conductor layer 124 so as to be respectively arranged along a direction intersecting the ground wirings 102, for example, a direction orthogonal to the ground wirings 102. Each ground wiring 103 intersecting with the ground wirings 102 is formed in a straight line over the plurality of ground wiring 102 to connect the ground wirings 102. The plurality of ground wirings 103 are spaced in a direction along the ground wirings 102. The plurality of ground wirings 103 are formed so as to intersect with the ground wirings 102 with spacings, and connect the two ground wirings 102 adjacent to each other.

Note that FIG. 3A illustrates a case where the flexible printed wiring board 100 has a straight planar shape, but is not limited thereto. The flexible printed wiring board 100 may have a curved or bent planar shape. In this case, the pair of the signal wirings 110A and 110B constituting the differential signal wiring 110 and the ground wiring 102 may be formed so as to be curved or bent in accordance with the curvature or bending of the flexible printed wiring board 100 while maintaining the arrangement described above.

A part where the ground wiring 103 is not formed has a cross-section along the line A1-A2 as illustrated in FIG. 3B. At the part where the ground wiring 103 is not formed, neither the ground wiring 102 nor the ground wiring 103 is arranged at a position facing the signal wirings 110A and 110B of the differential signal wiring 110. On the other hand, a part where the ground wiring 103 is formed has a cross-section along the B1-B2 line as illustrated in FIG. 3C. At the part where the ground wiring 103 is formed, the ground wiring 103 is arranged so as to face the signal wirings 110A and 110B of the differential signal wiring 110.

Thus, in the present embodiment, the plurality of ground wirings 102 are formed so as not to overlap the signal wiring 110A and the signal wiring 110B projected on the conductor layer 124 in the facing direction in which the conductor layer 122 and the conductor layer 124 face each other. Note that the facing direction in which the conductor layer 122 and the conductor layer 124 face each other is the same direction as the lamination direction where the conductor layer 122, the base layer 123 and the conductor layer 124 are laminated. The plurality of ground wirings 102 are connected to each other by the plurality of ground wirings 103 arranged at predetermined intervals in the direction along the ground wirings 102.

Data communication by digital signals is performed between two semiconductor devices mounted on an electronic equipment. The electric signal is transmitted through signal wiring. A flexible printed wiring board, which is flexible and lightweight, is connected to a printed wiring board through a connector from the viewpoint of ease of wiring signal wiring in an electronic equipment and weight reduction. In addition, since the transmission speed of digital signals has been increased in a recent electronic equipment, impedance matching of the transmission line is also required to ensure signal quality. In order to achieve impedance matching, for example, one layer of a two-layer flexible printed wiring board is used as a signal layer and the other layer is used as a ground layer, and the conductor of the ground layer is formed in a mesh shape.

Due to the increasing capacity of image data processed by an electronic equipment, electric signals are transmitted in the order of Gbps (Giga bits per second) per one lane. In the high-speed data communication, differential signals are mainly used. When the transmission speed exceeds 1 Gbps, the ground becomes a factor of impedance mismatch even if it is mesh-like. In particular, when a ground wiring is intersected between a pair of signal wirings constituting a differential signal wiring when the ground wiring is projected on the signal wiring layer, the area where the differential signal wiring faces the ground wiring becomes large, and as a result, a large impedance mismatch occurs in the differential signal wiring. Furthermore, when the transmission speed exceeds 1 Gbps, transmission loss also affects signal quality. In particular, when a ground wiring is intersected between a pair of signal wirings constituting a differential signal wiring when the ground wiring is projected on the signal wiring layer, the area where the differential signal wiring faces the ground wiring becomes large, and the transmission loss of the differential signal wiring increases.

In contrast, in the present embodiment, the ground wirings 102 and 103 are arranged as described above. Therefore, when the ground wirings 102 and 103 are projected on the conductor layer 122 in the facing direction in which the conductor layer 122 and the conductor layer 124 face each other, only the ground wirings 103 arranged with spacings are located between the pair of the signal wiring 110A and the signal wiring 110B. In a plan view seen in the facing direction, the plurality of ground wirings 102 are arranged so as to be parallel to and not to overlap the pair of the signal wirings 110A and 110B. That is, in the present embodiment, when the ground wirings 102 and 103 are projected on the conductor layer 122 which is the signal wiring layer, the ground wirings 102 and 103 do not intersect between the pair of the signal wiring 110A and the signal wiring 110B constituting the differential signal wiring 110. Therefore, the area where the differential signal wiring 110 faces the ground wirings 102 and 103 becomes small. As a result, in the present embodiment, the transmission loss of the differential signal wiring 110 can be reduced while the impedance mismatch of the differential signal wiring 110 can be reduced or prevented. The arrangement of the ground wirings 102 and 103 does not impair the flexibility of the flexible printed wiring board 100.

Thus, according to the present embodiment, excellent high-speed transmission characteristics can be realized for the flexible printed wiring board 100 while securing the flexibility of the flexible printed wiring board 100. According to the present embodiment, signal quality can be ensured even in high-speed transmission in the order of Gbps.

Note that, from the viewpoint of reducing the transmission loss while reducing or preventing the impedance mismatch, it is preferable that the ground wirings 102 and 103 have the relation described below. Here, as illustrated in FIG. 3A, the width of the ground wiring 102 is W1, and the spacing, which is the distance between the two ground wirings 102 adjacent to each other, is D1. The width of the ground wiring 103 is W2, and the spacing, which is the distance between the two ground wirings 103 adjacent to each other, is D2. The width of the signal wirings 110A and 110B is W3, and the spacing, which is the distance between the pair of the signal wirings 110A and 110B, is D3. The spacing, which is the distance between the two differential signal wirings 110 adjacent to each other, is D4. The spacing, which is the distance between the ground wiring 102 and the signal wiring 110A or the signal wiring 110B adjacent to each other, is D5. The pitch of the ground wiring 103 is to P. Note that the widths W1 to W3, the spacings D1 to D5, and the pitch P are those in a plan view viewed in the facing direction in which the conductor layer 122 and the conductor layer 124 face each other.

First, the spacing D2 between the two ground wirings 103 adjacent to each other is preferably 40 times the width W2 of the ground wiring 103 or more. With the ground wiring 103 adjacent to each other being arranged apart with such a spacing D2, the area where the differential signal wiring 110 faces the ground wiring 103 can be made smaller.

Note that the ground wiring 103 is preferably arranged at a pitch P of 10 mm or less. With the ground wiring 103 being arranged at such a pitch P, the potential difference between the two ground wirings 102 connected by the ground wiring 103 can be reduced or the occurrence of the potential difference can be prevented.

The spacing D4 between the two differential signal wrings 110 adjacent to each other is preferably wider than the spacing D3 between the pair of the signal wrings 110A and 110B. With the two differential signal wirings 110 adjacent to each other being arranged at such a spacing D4, the two differential signal wirings 110 adjacent to each other can be more reliably electrically separated.

The spacing D5 between the ground wiring 102 and the signal wiring 110A or the signal wiring 110B adjacent to each other is preferably wider than the spacing D3 between the pair of the signal wirings 110A and 110B. With the signal wrings 110A and 110B being arranged in this manner, the transmission characteristics of the differential signal wring 110 constituted by the signal wrings 110A and 110B can be improved.

The width W1 of the ground wiring 102 is preferably wider than the width W3 of the signal wirings 110A and 110B. With the ground wiring 102 having such a width W1, the ground wiring 102 can sufficiently function as a ground.

Figure 4A:
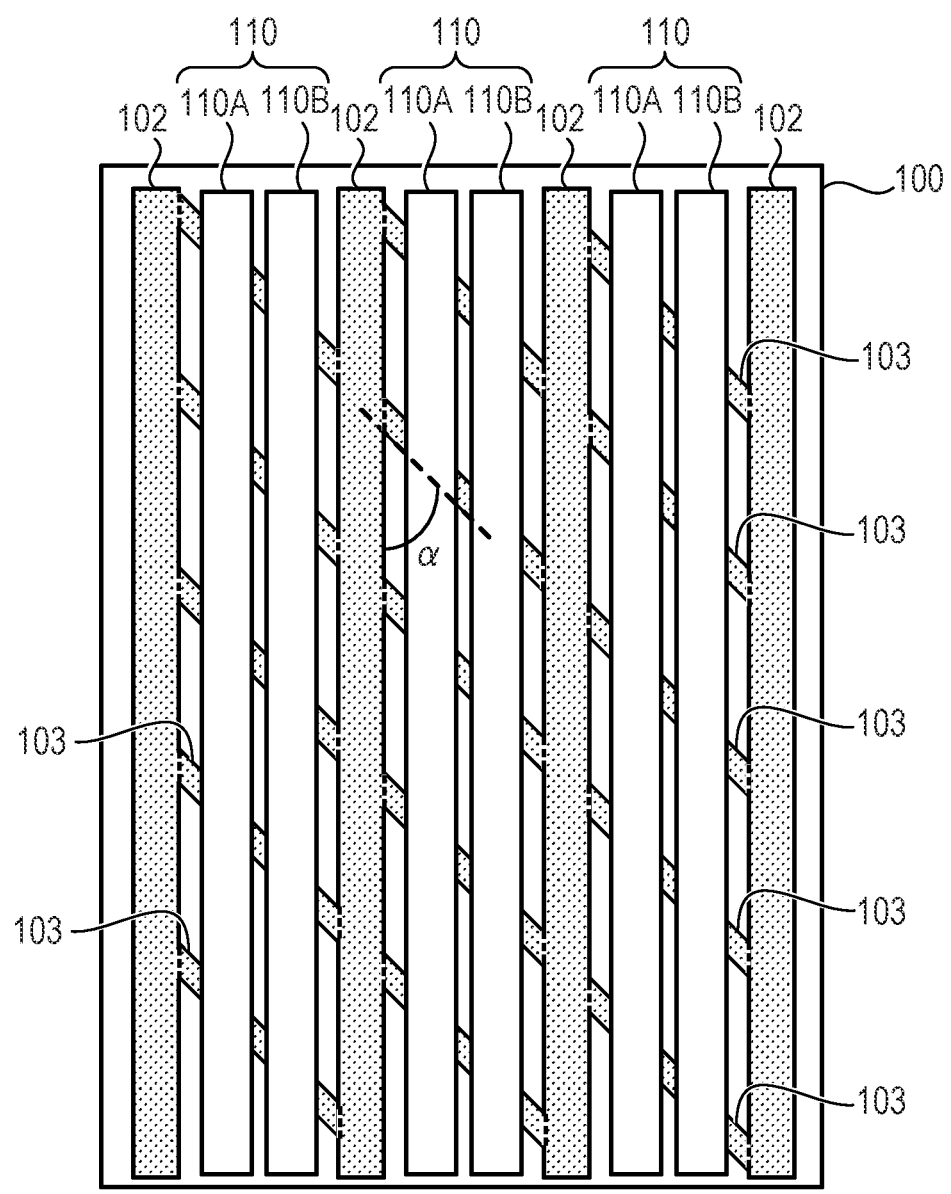
FIG. 4A is a plan view illustrating a modified example of the flexible printed wiring board according to the first embodiment of the present invention.
Figure 4B:
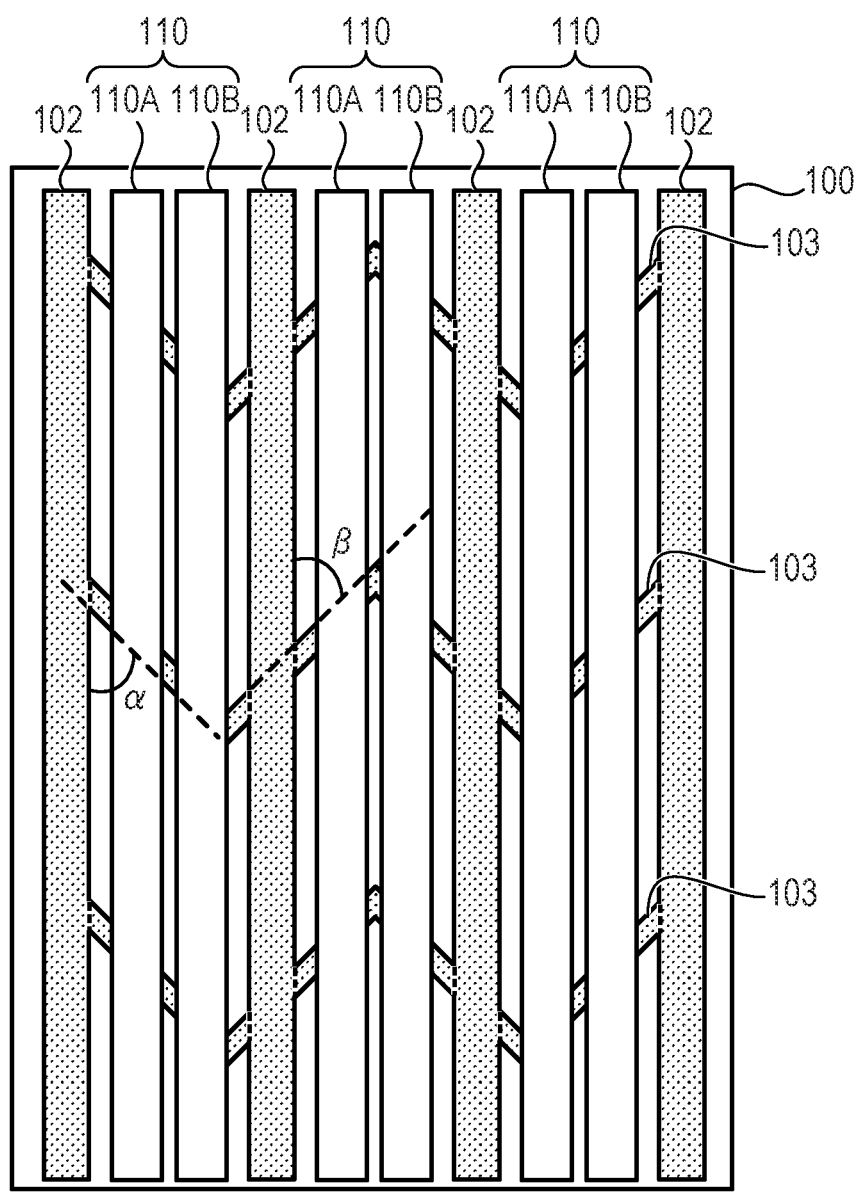
FIG. 4B is a plan view illustrating a modified example of the flexible printed wiring board according to the first embodiment of the present invention.
Figure 4C:
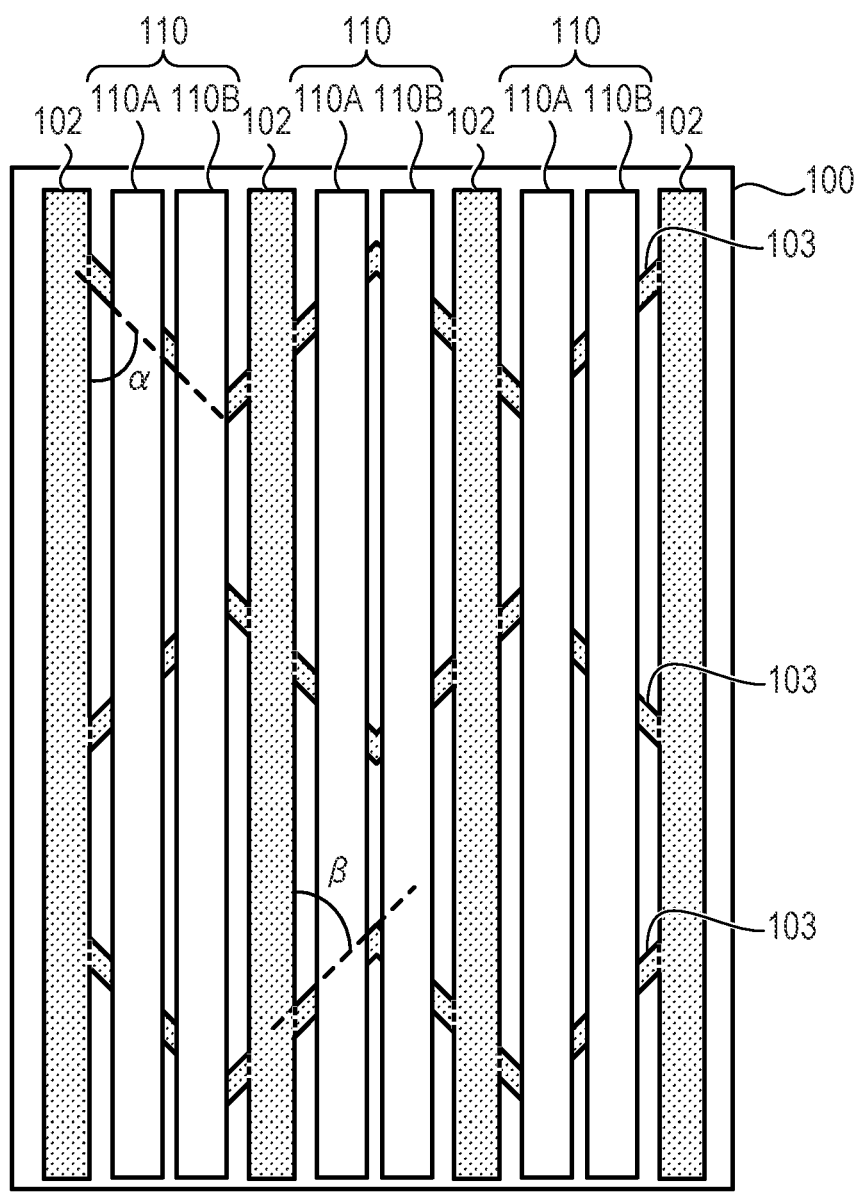
FIG. 4C is a plan view illustrating a modified example of the flexible printed wiring board according to the first embodiment of the present invention.

Note that, in the present embodiment, the case where the ground wiring 102 and the ground wiring 103 are orthogonal is described as an example, but the manner in which the ground wiring 102 and the ground wiring 103 intersect is not limited thereto. FIG. 4A, FIG. 4B, and FIG. 4C are plan views illustrating the ground wirings 102 and 103 according to modified examples of the present embodiment.

As illustrated in FIG. 4A, an angle α at which the ground wiring 102 and the ground wiring 103 intersect may be greater than 0 degrees and less than 90 degrees. In this case, each of the ground wirings 103 intersecting at the angle α is formed in a straight line over the plurality of ground wirings 102 to connect the ground wirings 102. FIG. 4A illustrates a case where the angle α is 45 degrees.

As illustrated in FIG. 4B and FIG. 4C, the ground wiring 103 may intersect one of the two ground wirings 102 adjacent to each other at an angle α from one side, and the ground wiring 103 may intersect the other at an angle β from the opposite side. In this case, the angles α and β are respectively greater than 0 degrees and less than 90 degrees, and may be the same or different from each other. FIG. 4B and FIG. 4C illustrate cases where the angles α and β are both 45 degrees. FIG. 4B illustrates a case where the plurality of ground wirings 103 connecting the two ground wirings 102 adjacent to each other intersect with the ground wirings 102 at the same angle α or angle β. FIG. 4C illustrates a case where the plurality of ground wirings 103 connecting the two ground wirings 102 adjacent to each other intersect the ground wirings 102 at the angles α and β alternately.

In the present embodiment, the flexible printed wiring board 100 having two layers of the conductor layers 122 and 124 has been described as an example, but the layer configuration of the flexible printed wiring board 100 is not limited thereto. For example, the layer configuration may be a layer configuration in which a ground layer is formed by printing a conductive material on a flexible printed wiring board with a single signal wiring layer.

Next, the impedance characteristics and the loss characteristics of the flexible printed wiring board 100 according to the present embodiment are shown by using Examples 1 and 2 and Comparative Example to show specific numerical values such as the thickness of the layer and the wiring width, and the like.

Example 1

In Example 1, the thickness of the cover layer 121 was 30.5 μm. The thickness of the conductor layer 122 was 20 μm. The thickness of the base layer 123 was 12.5 μm. The thickness of the conductor layer 124 was 20 μm. The thickness of the cover layer 125 was 30.5 μm. The relative dielectric constant of the cover layers 121 and 125 was 3.3 and the dissipation factor of the cover layers 121 and 125 was 0.015. The relative dielectric constant of the base layer 123 was 3.6 and the dissipation factor of the base layer 123 was 0.006.

The width W3 of the signal wrings 110A and 110B was 60 μm. The spacing D3 between the signal wrings 110A and 110B was 50 μm. The width W1 of the ground wiring 102 was 120 μm. The width W2 of the ground wiring 103 was 250 μm. The spacing D5 between the signal wring 110A and the ground wring 102 on the left side of the signal wring 110A was 120 μm. The spacing D5 between the signal wring 110B and the ground wring 102 on the right side of the signal wring 110B was also 120 μm. The spacing D1 between the ground wirings 103 was 410 μm. The pitch P of the arrangement of the ground wiring 103 in the longitudinal direction of the flexible printed wiring board 100 was 10 mm. The wiring length of the flexible printed wiring board 100 was 50 mm. In the above numerical example, the differential impedance of the cross-section along the line A1-A2 was 99.4Ω.

Example 2

Variations from Example 1 will be described. In Example 2, the width W2 of the ground wiring 103 was 120 m. The pitch P of the arrangement of the ground wiring 103 in the longitudinal direction of the flexible printed wiring board 100 was 5 mm. Other points were the same as in Example 1.

(Comparison of Transmission Characteristics)

A structure excluding the ground wiring 103 from Example 1 was used as Comparative Example, and transmission characteristics (TDR characteristics and signal transmission characteristics) were compared with those of Examples 1 and 2. Specifically, the time domain reflectometry (TDR) characteristics and the signal transmission characteristics were simulated as transmission characteristics, and the results were compared. The simulations were performed by HyperLynx of Siemens and HSPICE of Synopsys.

Figure 5A:
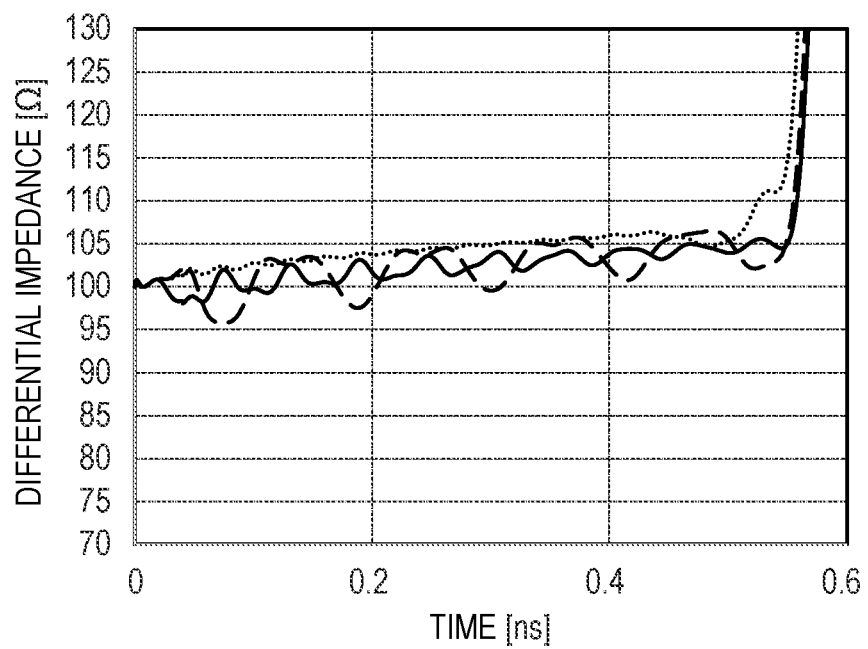
FIG. 5A is a graph showing the time domain reflection characteristics of examples and a comparative example in comparison.

FIG. 5A is a graph showing the simulation results of the TDR characteristics. In FIG. 5A, the vertical axis indicates differential impedance [Ω] and the horizontal axis indicates time [ns]. The long dashed line shows the TDR characteristic of Example 1, the solid line shows the TDR characteristic of Example 2, and the short dashed line shows the TDR characteristic of Comparative Example.

In Comparative Example, there was no ground wiring 103, and the structure continuously had the cross-section along the A1-A2 line illustrated in FIG. 3B. Therefore, Comparative Example showed uniform TDR characteristics. In Comparative Example, the differential impedance was determined by the differential signal wiring 110 and the ground wiring 102 illustrated in the cross-section along the line A1-A2.

In contrast, in each of Examples 1 and 2, the differential impedance was lowered at a position where the differential signal wiring 110 crossed the ground wiring 103 because of the ground wiring 103. However, compared with Comparative Example, the variation amount in Example 1 was 10% or less, and the variation amount in Example 2 was 5% or less. Note that, if the width W2 of the ground wiring 103 is narrower than in Examples 1 and 2, the distance where the differential signal wiring 110 crosses the ground wiring 103 becomes shorter, and the decrease in the differential impedance is further suppressed.

Figure 5B:
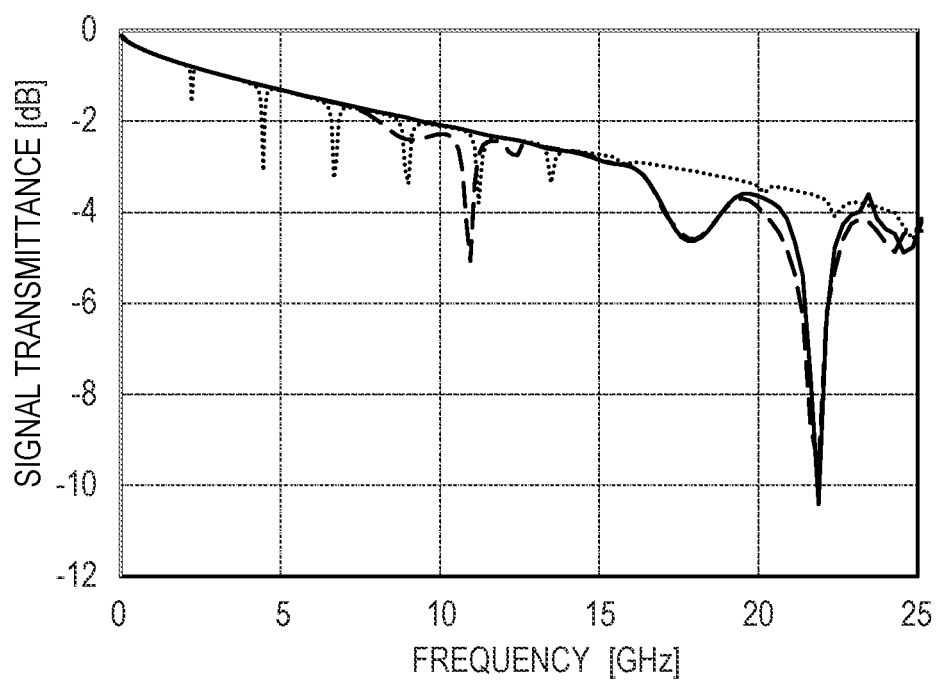
FIG. 5B is a graph showing the signal transmission characteristics of the examples and the comparative example in comparison.

FIG. 5B is a graph showing the simulation results of the signal transmission characteristics. In FIG. 5B, the vertical axis indicates the signal transmission amount [dB] and the horizontal axis indicates the frequency [GHz]. The long dashed line shows the signal transmission characteristic of Example 1, the solid line shows the signal transmission characteristic of Example 2, and the short dashed line shows the signal transmission characteristic of Comparative Example.

In Comparative Example, resonance occurred in the signal transmission characteristics at approximately every 2.2 GHz, and frequencies at which the signal transmission characteristics was significantly reduced were generated at frequencies which are integer multiples of 2.2 GHz. Therefore, in Comparative Example, the transmission loss increased at a transmission rate corresponding to the resonance frequency, for example, 4.4 Gbps (the resonance frequency 2.2 GHz), and the signal quality deteriorated.

In contrast, in Example 1, the first resonance frequency was approximately 11 GHz. Therefore, in Example 1, no significant transmission loss occurred up to approximately 20 Gbps (the fundamental frequency 10 GHz). In Example 2, the first resonance frequency was approximately 22 GHz. Therefore, in Example 2, no significant transmission loss occurred up to approximately 40 Gbps (the fundamental frequency 20 GHz). Note that, by further narrowing the pitch P of the ground wiring 103, the resonance frequency can be further shifted to the high frequency side.

In Comparative Example with only the thin and independent ground wirings 102 as illustrated in the cross-section along the A1-A2 line, the impedance of the ground wirings 102 became high, so that the resonance occurred at a frequency lower than that of Examples 1 and 2. In contrast, in Examples 1 and 2 in which the ground wirings 103 were formed in addition to the ground wirings 102, the ground wirings 102 were connected to each other by the ground wirings 103, thereby increasing the area of the ground wirings 102 and 103. Therefore, in each of Examples 1 and 2, the impedance of the ground wirings 102 and 103 became low and the resonance frequency became high.

Second Embodiment

A flexible printed wiring board according to a second embodiment of the present invention will be described with reference to FIG. 6A to FIG. 7C. Note that the same components as those in the first embodiment described above are labeled with the same reference numerals and the description thereof will be omitted or simplified.

Figure 6A:
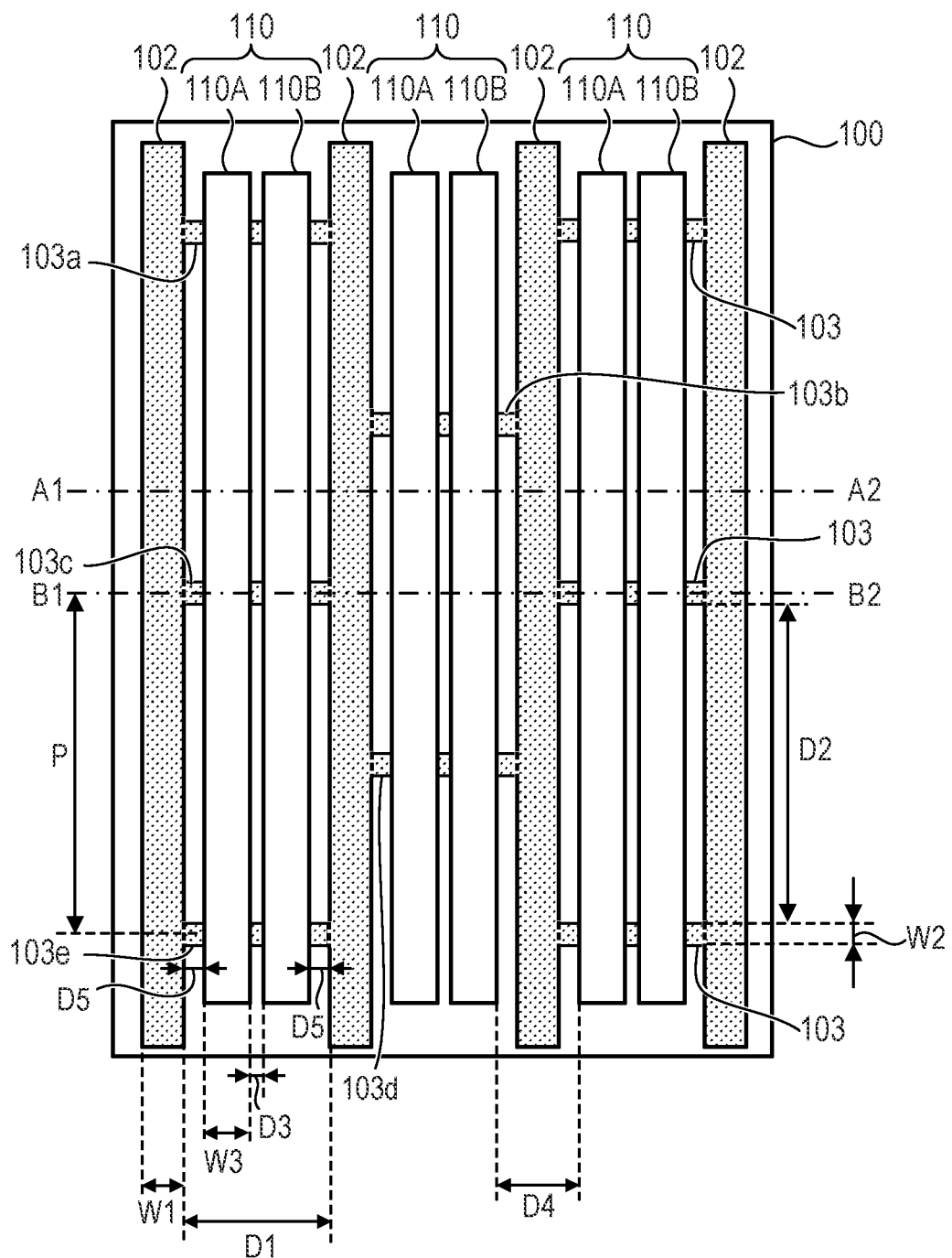
FIG. 6A is a plan view illustrating a flexible printed wiring board according to a second embodiment of the present invention.
Figure 6B:
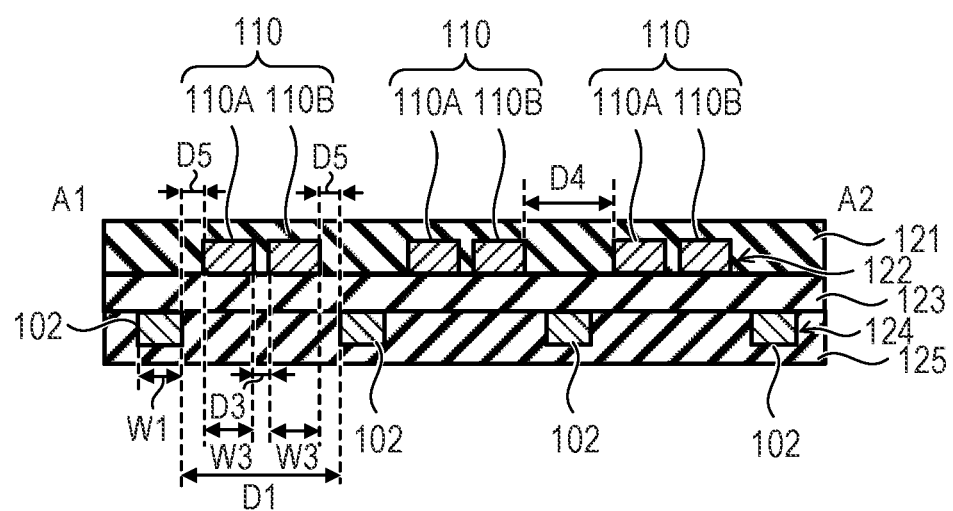
FIG. 6B is a cross-sectional view illustrating the flexible printed wiring board according to the second embodiment of the present invention.
Figure 6C:
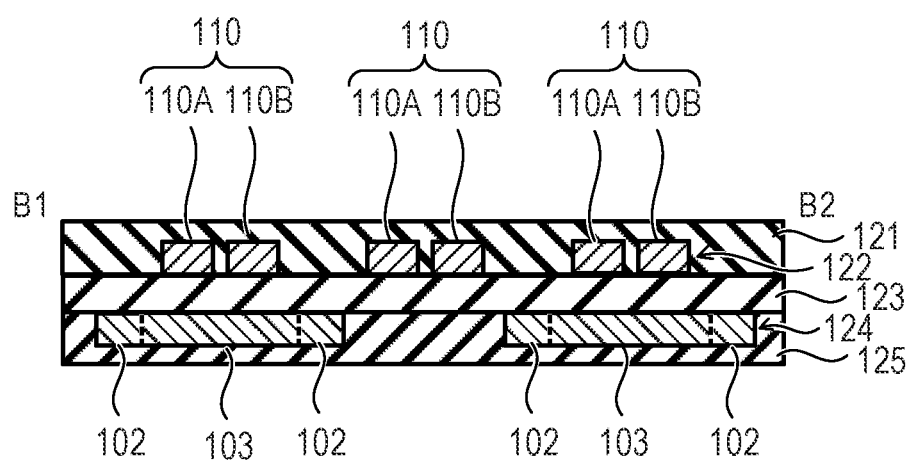
FIG. 6C is a cross-sectional view illustrating the flexible printed wiring board according to the second embodiment of the present invention.

FIG. 6A is a plan view of the flexible printed wiring board 100 according to the present embodiment viewed from the top. FIG. 6B is a cross-sectional view of the flexible printed circuit board 100 along line A1-A2 in FIG. 6A. FIG. 6C is a cross-sectional view illustrating the cross-section along the B1-B2 line in FIG. 6A. In the present embodiment, since the layer configuration and the structure of the signal wiring are the same as those in the first embodiment, parts different from those in the first embodiment will be described.

FIG. 6A illustrates the arrangement of the differential signal wirings 110 and the ground wirings 102 and 103 in a plan view of the flexible printed wiring board 100 viewed from the side of the cover layer 121, that is, in a plan view viewed in the facing direction in which the conductor layer 122 and the conductor layer 124 face each other.

As illustrated in FIG. 6A, the plurality of differential signal wirings 110 and the plurality of ground wirings 102 are wired parallel to each other along the longitudinal direction of the flexible printed wiring board 100 in the same manner as in the first embodiment. Also in the present embodiment, since the pair of the signal wiring 110A and the signal wiring 110B are disposed between the two ground wirings 102 adjacent to each other, the signal wiring 110A and the signal wiring 110B do not overlap the ground wirings 102 projected on the conductor layer 122.

The two ground wirings 102 adjacent to each other are connected by the plurality of ground wirings 103. The two ground wirings 102 adjacent to each other are connected by the plurality of ground wirings 103 respectively arranged along a direction intersecting the ground wirings 102, for example, a direction orthogonal to the ground wirings 102.

In the present embodiment, the position of the ground wiring 103 connecting the ground wiring 102 is different for each differential signal wiring 110 which the ground wiring 103 faces in the facing direction in which the conductor layer 122 and the conductor layer 124 face each other. That is, unlike the ground wiring 103 arranged in a straight line in the first embodiment, the ground wirings 103 are arranged so that the ground wirings 103 are shifted by, for example, half a pitch (½P) from each other for each differential signal wiring 110 in the longitudinal direction of the flexible printed wiring board 100.

For example, as illustrated in FIG. 6A, the two ground wirings 102 adjacent to each other on the left side in the figure are connected by ground wirings 103a, 103c, and 103e as the ground wirings 103. The two ground wirings 102 adjacent to each other in the center of the figure are connected by ground wirings 103b and 103d as the ground wirings 103. The ground wirings 103a, 103c, and 103e and the ground wirings 103b and 103d are arranged so as to be shifted by half a pitch from each other in the longitudinal direction of the flexible printed wiring board 100. Note that the shift amount of the ground wiring 103 shifting for each differential signal wiring 110 is not limited to half a pitch, but can be set to an appropriate size.

As in the first embodiment, the part where the ground wiring 103 is not formed has the cross-section along the A1-A2 line as illustrated in FIG. 6B, in which the ground wirings 102 and 103 are not arranged at a position facing the signal wiring 110A and 110B of the differential signal wiring 110. In the present embodiment, as illustrated in FIG. 6C, the cross-section along the B1-B2 line includes a part where the ground wiring 103 is arranged to face the signal wirings 110A and 110B of the differential signal wiring 110 and a portion where the ground wiring 103 is not arranged.

As in the present embodiment, the plurality of ground wirings 103 need not necessarily be formed in a straight line shape for the plurality of differential signal wirings 110, and may be displaced from each of the differential signal wirings 110.

Figure 7B:
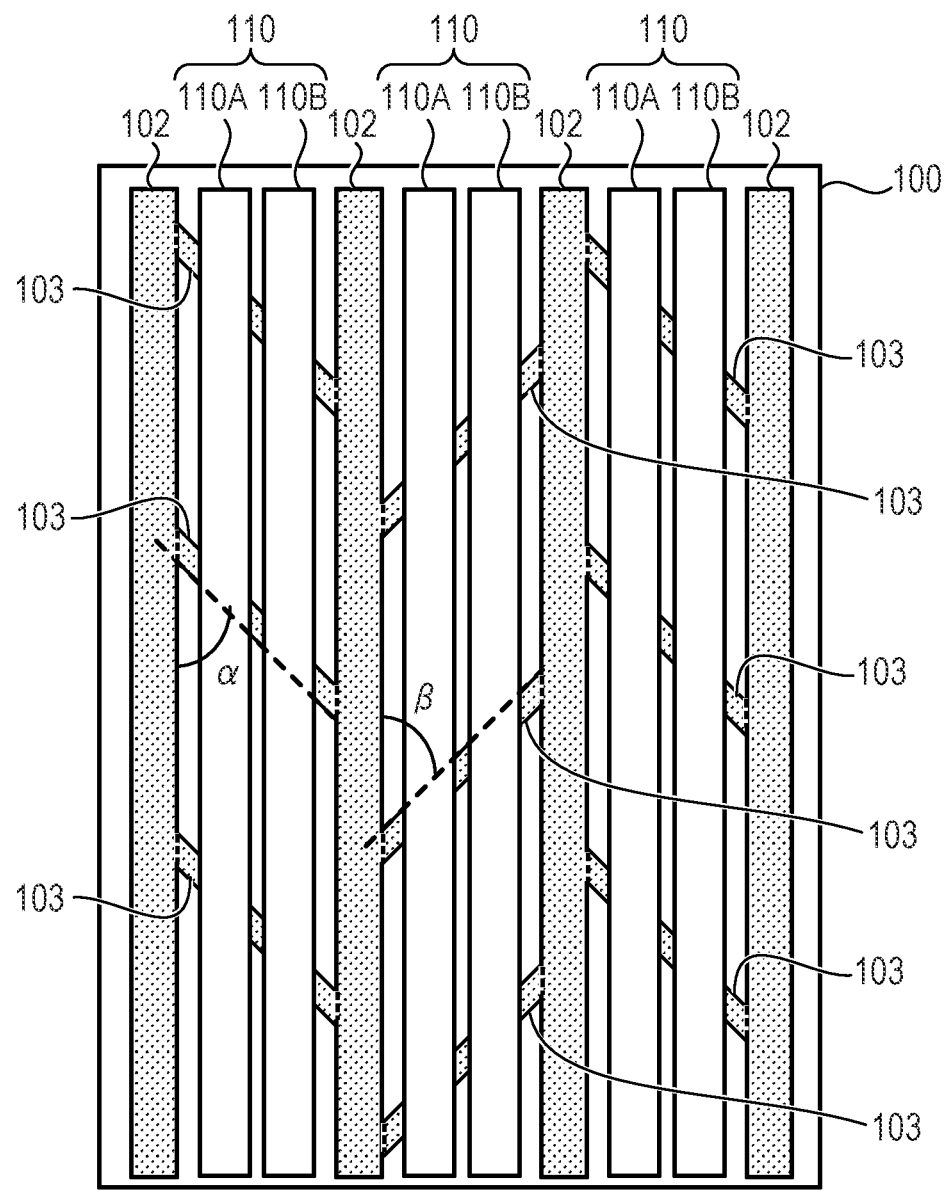
FIG. 7B is a plan view illustrating a modified example of the flexible printed wiring board according to the second embodiment of the present invention.
Figure 7C:
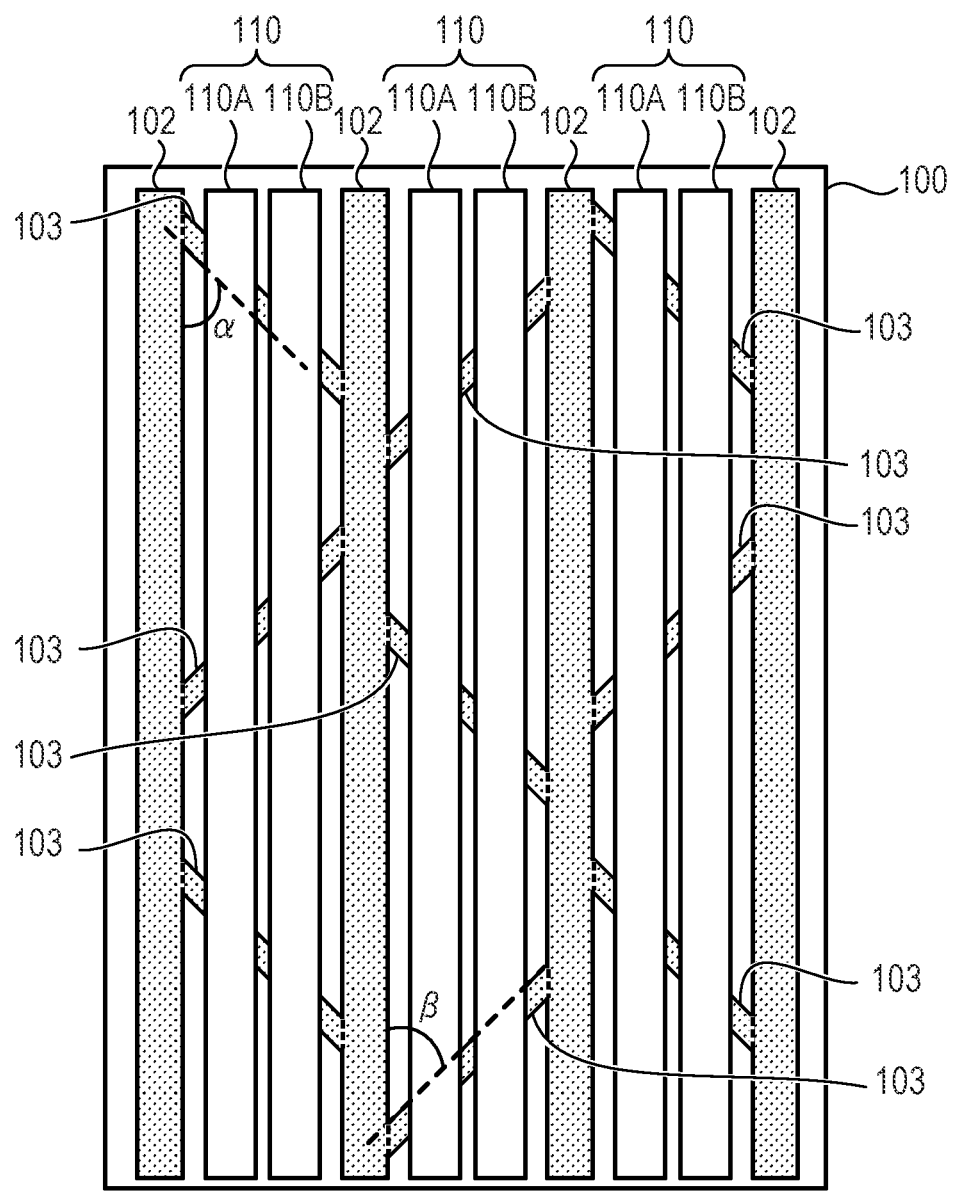
FIG. 7C is a plan view illustrating a modified example of the flexible printed wiring board according to the second embodiment of the present invention.

Noted that, in the above, the case where the ground wiring 102 and the ground wiring 103 are orthogonal to each other is described as an example, the manner in which the ground wiring 102 and the ground wiring 103 intersect is not limited thereto. FIG. 7A, FIG. 7B, and FIG. 7C are plan views illustrating the ground wirings 102 and 103 according to modified examples of the present embodiment.

As illustrated in FIG. 7A, an angle α at which the ground wiring 102 and the ground wiring 103 intersect may be greater than 0 degrees and less than 90 degrees. In this case, each of the ground wirings 103 intersecting at the angle α is displaced for each of the differential signal wirings 110. FIG. 7A illustrates a case where the angle α is 45 degrees.

As illustrated in FIG. 7B and FIG. 7C, the ground wiring 103 may intersect one of the two ground wirings 102 adjacent to each other at an angle α from one side, and the ground wiring 103 may intersect the other at an angle β from the opposite side. In this case, the angles α and β are respectively greater than 0 degrees and less than 90 degrees, and may be the same or different from each other. FIG. 7A and FIG. 7C illustrate cases where the angles α and β are both 45 degrees. FIG. 7B illustrates a case where the plurality of ground wirings 103 connecting the two ground wirings 102 adjacent to each other intersect with the ground wirings 102 at the same angle α or angle β. FIG. 7C illustrates a case where the plurality of ground wirings 103 connecting two ground wirings 102 adjacent to each other intersect the ground wirings 102 at the angles α and β alternately.

Note that, while the two-layered flexible printed wiring board has been shown as the embodiment, a conductive material may be printed as a ground layer on a flexible printed wiring board with a single signal wiring layer. In the present embodiment, the flexible printed wiring board 100 having two layers of the conductor layers 122 and 124 has been described as an example, but the layer configuration of the flexible printed wiring board 100 is not limited thereto. For example, the layer configuration may be a layer configuration in which a ground layer is formed by printing a conductive material on a flexible printed wiring board with a single signal wiring layer.

Next, the flexible printed wiring board 100 according to the present embodiment will be described with reference to Example 3.

Example 3

Example 3 was the same as Example 1 except that the ground wiring 103 was arranged so as to be shifted for each differential signal wiring 110. In Example 3, the pitch P of the arrangement of the ground wirings 103a, 103c, and 103e in the longitudinal direction of the flexible printed wiring board 100 was 10 mm. The pitch P of the arrangement of 103b and 103d in the longitudinal direction of the flexible printed wiring boards 100 was also 10 mm. On the other hand, the pitch of the arrangement of the ground wirings 103a and 103b in the longitudinal direction of the flexible printed wiring board 100 was 5 mm, a half of the pitch P.

The ground wirings 103 of Example 3 were arranged so as to be shifted by half a pitch for each differential signal wiring 110 with respect to the ground wirings 103 of Example 1. Therefore, in Example 3, there were places where the impedance of the ground wiring 102 was lowered every 5 mm. However, in Example 3, since the ground wirings 103 were not formed in a straight line as in Example 1, the resonance frequency did not become twice as high as in Example 1, but the first resonance frequency became 11.3 GHz and the resonance frequency became higher than in Example 1.

The present invention is not limited to the above-described embodiments, and many modifications are possible within the technical concept of the present invention. Also, the effects described in the embodiments are only a list of the most suitable effects resulting from the present invention, and the effects of the present invention are not limited to those described in the embodiments.

In the first and second embodiments, the case where the wiring board of the present invention is applied to an imaging apparatus such as a digital camera as an example of an electronic equipment has been described, but the present invention is not limited thereto. The wiring board of the present invention can be applied to an electronic equipment capable of mounting electronic units, such as mobile communication devices, wearable devices, image forming devices, and the like, for example. The mobile communication devices include devices such as smartphones, tablet PCs, and game consoles. The image forming devices include printers, copiers, facsimiles, multifunctional machines equipped with these functions, and the like. When a flexible printed wiring board is used as the wiring board, the flexible printed wiring board can be suitably used for image stabilization mechanisms for cameras by making use of its flexibility.

According to the present invention, higher speed transmission characteristics can be realized.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-114387, filed Jul. 15, 2022, which is hereby incorporated by reference herein in its entirety.

What is claimed is:

1. A wiring board that is a flexible printed wiring board comprising:
   a base layer of resin;
   a plurality of differential signal wirings, each of which includes a pair of signal wirings, formed on the base layer;
   a first ground wiring formed on the base layer; and
   a second ground wiring formed on the base layer,
   wherein the plurality of differential signal wirings include a first differential signal wiring and a second differential signal wiring, which extend in a first direction and are aligned in a second direction intersecting the first direction,
   wherein the first ground wiring includes a first wiring, a second wiring, and a third wiring, which extend in the first direction and are aligned in the second direction,
   wherein the second ground wiring includes:
      a fourth wiring and a fifth wiring facing the first differential signal wiring in a third direction via the base layer and spaced apart from each other in the first direction in a plan view viewed in the third direction; and
      a sixth wiring and a seventh wiring facing the second differential signal wiring in the third direction via the base layer and spaced apart from each other in the first direction in the plan view viewed in the third direction,
   wherein the first wiring is arranged along the first differential signal wiring so that the first differential signal wiring is positioned between the first wiring and the second wiring, in the plan view viewed in the third direction,
   wherein the second wiring is arranged along the first differential signal wiring and the second differential signal wiring so as to be positioned between the first differential signal wiring and the second differential signal wiring, in the plan view viewed in the third direction,
   wherein the third wiring is arranged along the second differential signal wiring so that the second differential signal wiring is positioned between the second wiring and the third wiring, in the plan view viewed in the third direction,
   wherein, in the plan view viewed in the third direction, a spacing between the second wiring and the first differential signal wiring is wider than a spacing between the pair of signal wirings of the first differential signal wiring, and a spacing between the second wiring and the second differential signal wiring is wider than a spacing between the pair of signal wiring of the second differential signal wiring, and
   wherein the fourth wiring and the fifth wiring are electrically connected to the sixth wiring and the seventh wiring.

2. The wiring board according to claim 1, wherein the set of the fourth wiring and the fifth wiring are electrically connected to the set of the sixth wiring and the seventh wiring via the second ground wiring.

3. The wiring board according to claim 1, wherein a spacing between the forth wiring and the fifth wiring in the first direction is 40 or more times a width of the first wiring, and a spacing between the sixth wiring and the seventh wiring in the first direction is 40 or more times a width of the third wiring.

4. The wiring board according to claim 1, wherein a spacing between the forth wiring and the fifth wiring in the first direction is 10 mm or less, and a spacing between the sixth wiring and the seventh wiring in the first direction is 10 mm or less.

5. The wiring board according to claim 1, wherein the fourth wiring is positioned on a straight line along the second direction, the second ground wiring is not positioned in a position overlapping the second differential signal wiring on the straight line along the second direction, and the straight line is positioned between the sixth wiring and the seventh wiring.

6. The wiring board according to claim 1, wherein a spacing between the first differential signal wiring and the second differential signal wiring is wider than the spacing between the pair of signal wirings of the first differential signal wiring and the pair of signal wirings of the second differential signal wiring.

7. The wiring board according to claim 1, wherein a spacing between the first wiring and the second wiring is wider than a spacing between the first differential signal wiring and the second differential signal wiring.

8. The wiring board according to claim 1, wherein a width of the first wiring is wider than a width of one of the pair of the signal wirings of the first differential signal wiring.

9. The wiring board according to claim 1,
wherein the base layer has a first surface and a second surface facing the first surface,
wherein the plurality of differential signal wirings are formed on the first surface, and
wherein the plurality of first ground wirings and the plurality of second ground wirings are formed on the second surface.

10. The wiring board according to claim 9, wherein a thickness of the base layer is 10 μm or more and 100 μm or less.

11. Electronic equipment comprising:
the wiring board according to claim 1; and
a housing in which the wiring board is accommodated.

12. The electronic equipment according to claim 11,
wherein a wireless communication unit capable of performing wireless communication with an external device is accommodated in the housing, and
wherein, in the housing, the second ground wiring of the wiring board is positioned closer to the wireless communication unit than the plurality of differential signal wirings of the wiring board.

13. The electronic equipment according to claim 11, wherein the first ground wiring and the second ground wiring are electrically connected.

14. A unit comprising a first circuit board, a second circuit board, and the wiring board according to claim 1 that electrically connects the first circuit board and the second circuit board.

15. The unit according to claim 14,
wherein the first circuit board includes a first semiconductor device, and
wherein the second circuit board includes a second semiconductor device.

16. The unit according to claim 15, wherein the first semiconductor device is an image sensor.

17. The unit according to claim 16, wherein the second semiconductor device is a digital signal processor.

18. Electronic equipment comprising:
the unit according to claim 17; and
a housing in which the unit is accommodated.

19. The electronic equipment according to claim 18, wherein the electronic equipment comprises a wireless communication unit that is capable of performing wireless communication with an external device and is accommodated in the housing.

20. The electronic equipment according to claim 18, wherein the electronic equipment is configured so that a lens unit is detachable.

* * * * *